United States Patent
Choi et al.

(10) Patent No.: US 7,092,308 B2
(45) Date of Patent: Aug. 15, 2006

(54) PORTABLE DATA STORAGE APPARATUS

(75) Inventors: Jin-Hyeok Choi, Yongin-si (KR);
Sam-Yong Bahng, Sungnam-si (KR);
Chil-Hee Chung, Seoul (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 0 days.

(21) Appl. No.: 10/981,367

(22) Filed: Nov. 4, 2004

(65) Prior Publication Data

US 2005/0152202 A1 Jul. 14, 2005

(30) Foreign Application Priority Data

Jan. 13, 2004 (KR) .................. 10-2004-0002394

(51) Int. Cl.
*G11C 5/14* (2006.01)
(52) U.S. Cl. .............. 365/226; 365/149; 365/189.06; 365/189.07; 365/189.11; 365/189.09

(58) Field of Classification Search .............. 365/226, 365/149, 189.06, 189.07, 189.11, 189.09
See application file for complete search history.

(56) References Cited

U.S. PATENT DOCUMENTS

| 2005/0052924 A1* | 3/2005 | Nishizawa et al. ......... 365/222 |
| 2005/0083751 A1* | 4/2005 | Fujiu et al ................. 365/222 |

\* cited by examiner

*Primary Examiner*—Tuan T. Nguyen
(74) *Attorney, Agent, or Firm*—F. Chau & Associates, LLC (57) ABSTRACT

A memory card including a non-volatile memory and a power management unit for receiving an external supply voltage to supply an operating voltage to the non-volatile memory, wherein when the external supply voltage is lower than a detection voltage, the power management unit boosts the external supply voltage and outputs the boosted voltage as the operating voltage of the non-volatile memory.

22 Claims, 5 Drawing Sheets

PORTABLE DATA STORAGE APPARATUS

CROSS-REFERENCE TO RELATED APPLICATION

This application claims priority to Korean Patent Application No. 2004-02394, filed on Jan. 13, 2004, in the Korean Intellectual Property Office, the disclosure of which is herein incorporated by reference in its entirety.

BACKGROUND

1. Technical Field

The present invention relates to a portable data storage apparatus, more particularly, a memory card that contains a non-volatile memory.

2. Discussion of Related Art

A smartcard—a type of memory card—is a card embedded with a memory in which data can be stored and retrieved. The smartcard receives its power from external sources like a card reader. Typically the memory inside this kind of memory card is a non-volatile memory such as EPROM, EEPROM or FLASH memory.

When connected with external sources like an electronic device, a memory card operates with a power supplied from the electronic device. When the power (hereinafter, referred to as an external supply voltage) supplied from the electronic device deviates from an operating voltage range of a non-volatile memory in the memory card, the non-volatile memory may not operate properly. For example, if the external supply voltage is lowered while writing/reading data in/from the non-volatile memory, erroneous data can be written/read in/from the non-volatile memory.

With conventional technology, lowering of an operating voltage of the non-volatile memory is limited due to a characteristic of the non-volatile memory that needs higher voltages than the external supply voltage. Furthermore, although an electronic device may operate with a low voltage (e.g. below 1.8V), it may be difficult to use a memory card having a non-volatile memory because non-volatile memories exhibit poor operating characteristics at low voltage. In other words, if a memory card having a non-volatile memory is applied to the low-voltage electronic device, the memory card may not operate reliably.

Therefore, a need exist for a power management system which can secure a stable operation of the non-volatile memory even when a memory card is supplied with an external supply voltage deviating from an operating voltage range of a non-volatile memory in the memory card.

SUMMARY OF THE INVENTION

In an exemplary embodiment of the present invention, a memory card comprises a non-volatile memory and a power management unit for receiving an external supply voltage to supply an operating voltage to the non-volatile memory, wherein when the external supply voltage is lower than a detection voltage, the power management unit boosts the external supply voltage and outputs the boosted voltage as the operating voltage of the non-volatile memory.

In another exemplary embodiment of the present invention, a memory card comprises a non-volatile memory and a power management unit for receiving an external supply voltage to supply an operating voltage to the non-volatile memory, wherein the power management unit includes a level detector circuit for detecting whether the external supply voltage is lower than a detection voltage and a voltage converter circuit for either boosting the external supply voltage or regulating the external supply voltage to the operating voltage based on a detection result of the level detector circuit.

In still another exemplary embodiment of the present invention, a memory card comprises a printed circuit board, a passive capacitor installed at the printed circuit board, a non-volatile memory chip installed at the printed circuit board, and a controller circuit chip installed at the printed circuit board, for receiving an external supply voltage to supply an operating voltage to the non-volatile memory chip, wherein the controller circuit chip performs a boosting operation using the passive capacitor when the external supply voltage is lower than a detection voltage, the boosted voltage being outputted as the operating voltage of the memory chip.

In another exemplary embodiment of the present invention, a memory card comprises a printed circuit board, a passive capacitor installed at the printed circuit board, a non-volatile memory chip installed at the printed circuit board, and a controller circuit chip installed at the printed circuit board, for receiving an external supply voltage and supplying an operating voltage to the non-volatile memory chip, wherein the control circuit chip includes a level detector circuit for detecting whether the external supply voltage is lower than a detection voltage and a booster control circuit for boosting the external supply voltage using the passive capacitor when the external supply voltage is lower than the detection voltage.

In another exemplary embodiment of the present invention, a memory card comprises a printed circuit board, a passive capacitor installed at the printed circuit board, and an integrated circuit chip installed at the printed circuit board and including a non-volatile memory and a controller circuit chip, wherein the integrated circuit chip includes a level detector circuit for detecting whether the external supply voltage is lower than a detection voltage, and a booster control circuit for boosting the external supply voltage using the passive capacitor when the external supply voltage is lower than the detection voltage.

BRIEF DESCRIPTION OF THE DRAWINGS

The present invention will become more apparent by describing in detail exemplary embodiments thereof with reference to the attached drawings.

DESCRIPTION OF PREFERRED EMBODIMENTS

Figure 1:
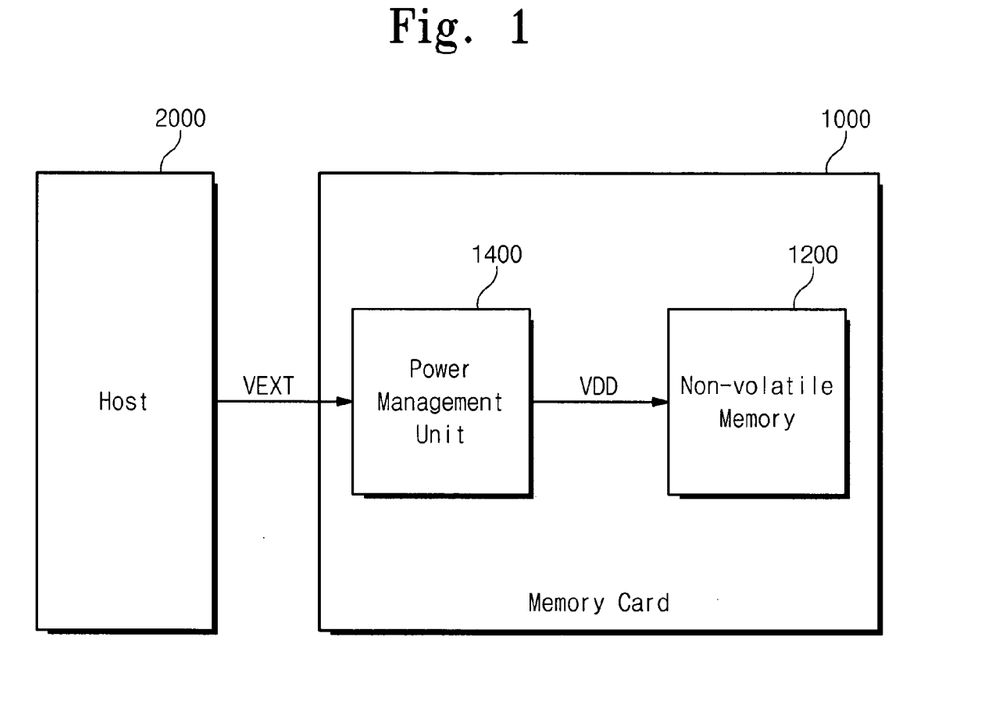
FIG. 1 is a schematic block diagram showing a memory card according to an exemplary embodiment of the present invention.

Referring to FIG. 1, a schematic block diagram showing a memory card according to an exemplary embodiment of the present invention is shown. A memory card 1000 includes a non-volatile memory 1200 and a power management unit (PMU) 1400. The non-volatile memory 1200 stores digital data information. The non-volatile memory 1200 may be a flash memory, a ferro-electric RAM (FRAM), a magneto-resistive RAM (MRAM), or a phase-change RAM (PRAM). The flash memory includes either a NAND-type memory or a NOR-type memory.

The power management unit 1400 receives an external supply voltage VEXT from a host 2000 and supplies an operating voltage VDD to the non-volatile memory 1200. The power management unit 1400 manages the operating voltage VDD of the non-volatile memory 1200 based on the external supply voltage VEXT and a detection voltage. In one exemplary embodiment, the detection voltage is set to be lower than the operating voltage VDD and higher than a minimum operating voltage of the non-volatile memory 1200. In another exemplary embodiment, the detection voltage is set to be the same as the minimum operating voltage of the non-volatile memory 1200. In still another exemplary embodiment, the detection voltage is set to be the same as the operating voltage VDD.

In exemplary embodiments of the present invention, the minimum operating voltage is the lowest voltage (e.g. 1.8V) of an operating range of the non-volatile memory 1200. A maximum operating voltage is the highest voltage (e.g. 2.4V) of the operating range of the non-volatile memory 1200. The operating voltage VDD is a voltage (e.g. 2.0V) between the minimum operating voltage and the maximum operating voltage.

When the external supply voltage VEXT is lower than the detection voltage, the power management unit 1400 boosts the external supply voltage up to a voltage lower than or the same as the operating voltage VDD and outputs the boosted voltage to the non-volatile memory 1200. When the external supply voltage VEXT is higher than the detection voltage and lower than the operating voltage VDD of the non-volatile memory 1200, the power management unit 1400 outputs the external supply voltage VEXT as the operating voltage VDD to the non-volatile memory 1200. When the external supply voltage VEXT is higher than the operating voltage VDD of the non-volatile memory 1200, the power management unit 1400 regulates (i.e., clamps) the external supply voltage VEXT and outputs the regulated voltage as the operating voltage VDD to the non-volatile memory 1200.

Thus, according to exemplary embodiments of the present invention, a stable operation of the non-volatile memory 1200 can be secured even when the external supply voltage VEXT is lower than the minimum operating voltage or the detection voltage. The low external supply voltage VEXT may be cause by, for example, a power consumption in the memory card.

Figure 2:
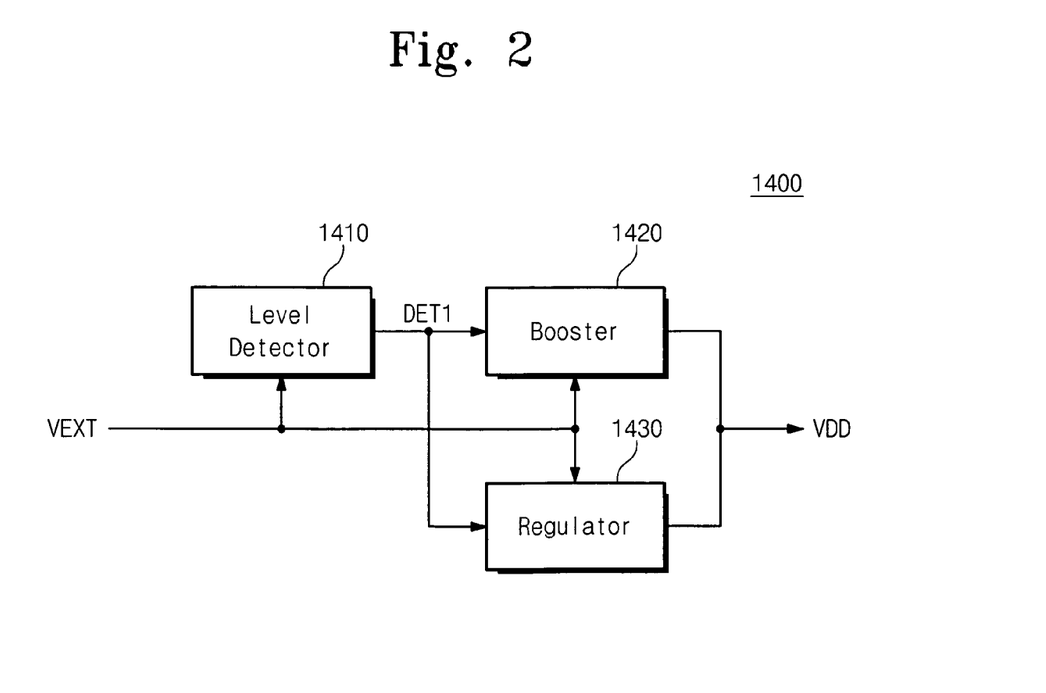
FIG. 2 is a schematic block diagram of a power management unit according to an exemplary embodiment of the present invention.

Referring to FIG. 2, a schematic block diagram showing a power management unit 1400 according to an exemplary embodiment of the present invention is shown. The power management unit 1400 includes a level detector circuit 1410, a booster circuit 1420, and a regulator circuit 1430. The power management unit 1400 operates with the external supply voltage VEXT supplied from the host 2000.

The level detector circuit 1410 determines whether the external supply voltage VEXT is lower than a detection voltage. As described above according to an exemplary embodiment of the present invention, the detection voltage is higher than a minimum operating voltage of the non-volatile memory 1200 and lower than an operating voltage thereof.

When the external supply voltage VEXT is lower than the detection voltage, the level detector circuit 1410 activates a detection signal DET1. When the external supply voltage VEXT is higher than the detection voltage, the level detector circuit 1410 inactivates a detection signal DET1. The booster circuit 1420 operates in response to activation of the detection signal DET1. The regulator circuit 1430 operates in response to inactivation of the detection signal DET1. That is, the booster circuit 1420 performs its boosting operation when the external supply voltage VEXT is lower than the detection voltage. The regulator circuit 1430 regulates the external supply voltage VEXT when the external supply voltage VEXT is higher than the detection voltage. The regulator circuit 1430 outputs an operating voltage VDD when the external supply voltage VEXT is higher than the detection voltage and lower than the operating voltage VDD of the non-volatile memory 1200. When the external supply voltage VEXT is higher than the operating voltage VDD of the non-volatile memory 1200, the regulator circuit 1430 makes the external supply voltage VEXT lowered to the operating voltage VDD.

The regulator circuit 1430 may output the operating voltage VDD when the external supply voltage VEXT is higher than the minimum operating voltage of the non-volatile memory 1200 and lower than the operating voltage VDD thereof. A reference voltage used in the regulator circuit 1430 is supplied from the level detector circuit 1410 or, alternatively, is generated in the regulator circuit 1430.

Figure 3:
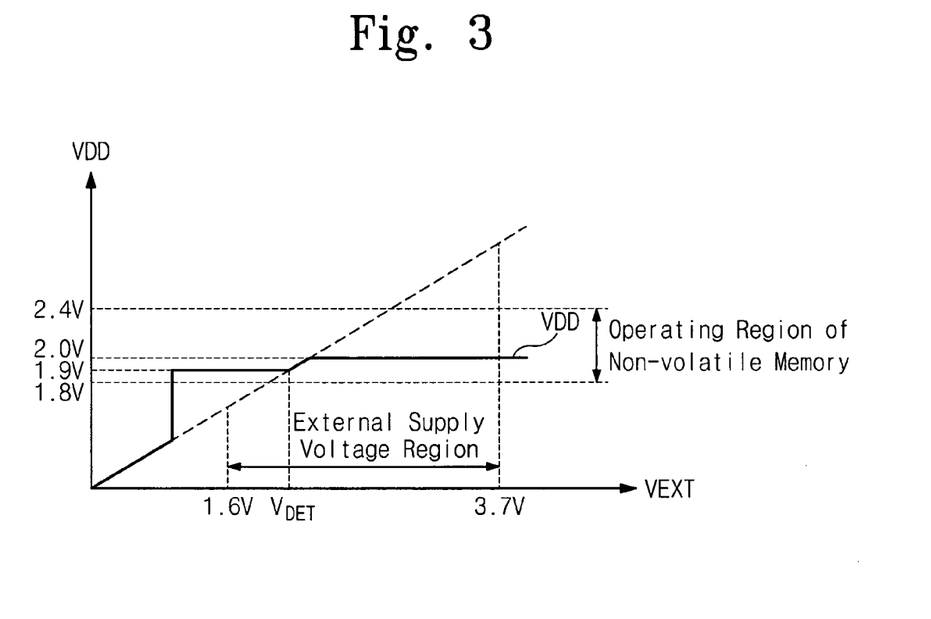
FIG. 3 is a graph showing an operating voltage generated in a power management unit according to an exemplary embodiment of the present invention.

Referring to FIG. 3, a diagram showing a graph of an operating voltage VDD generated in a power management unit 1400 according to an exemplary embodiment of the present invention is shown.

The non-volatile memory 1200 operates in an operating range from 1.8V to 2.4V. An operating voltage VDD of the non-volatile memory 1200 is 2.0V. In conventional technology, if the external supply voltage VEXT is lower than a minimum operating voltage (e.g. 1.8V) of the non-volatile memory 1200, a stable operation of the non-volatile memory 1200 may not be secured. To prevent this, in conventional technology, the external supply voltage VEXT becomes at least the minimum operating voltage of the non-volatile memory 1200. However, the external supply voltage VEXT may not be avoided to become lower than the minimum operating voltage of the non-volatile memory 1200 due to a power consumption in the memory card.

A memory card, according to an exemplary embodiment of the present invention, may secure a stable operation of the non-volatile memory 1200 even when the external supply voltage VEXT becomes lower than the minimum operating voltage of the non-volatile memory 1200 or the detection voltage VDET.

When the external supply voltage VEXT is higher than the operating voltage VDD of the non-volatile memory 1200, the external supply voltage VEXT is regulated to the operating voltage VDD of the non-volatile memory 1200. When the external supply voltage VEXT is lower than the operating voltage VDD of the non-volatile memory 1200 and higher than the detection voltage VDET, a voltage following the external supply voltage VEXT becomes the operating voltage VDD of the non-volatile memory 1200. This process can be accomplished by the regulator circuit 1430 in FIG. 2. When the external supply voltage VEXT is lower than the detection voltage VDET, the external supply voltage VEXT is boosted up to the detection voltage VDET. The boosted voltage becomes the operating voltage VDD of the non-volatile memory 1200. This process can be accomplished by the booster circuit 1420 in FIG. 2.

Therefore, according to an exemplary embodiment of the present invention, even when the external supply voltage VEXT deviates from an operating region (range) of the non-volatile memory 1200, the non-volatile memory 1200 installed at the memory card can perform its stable operation.

Figure 4:
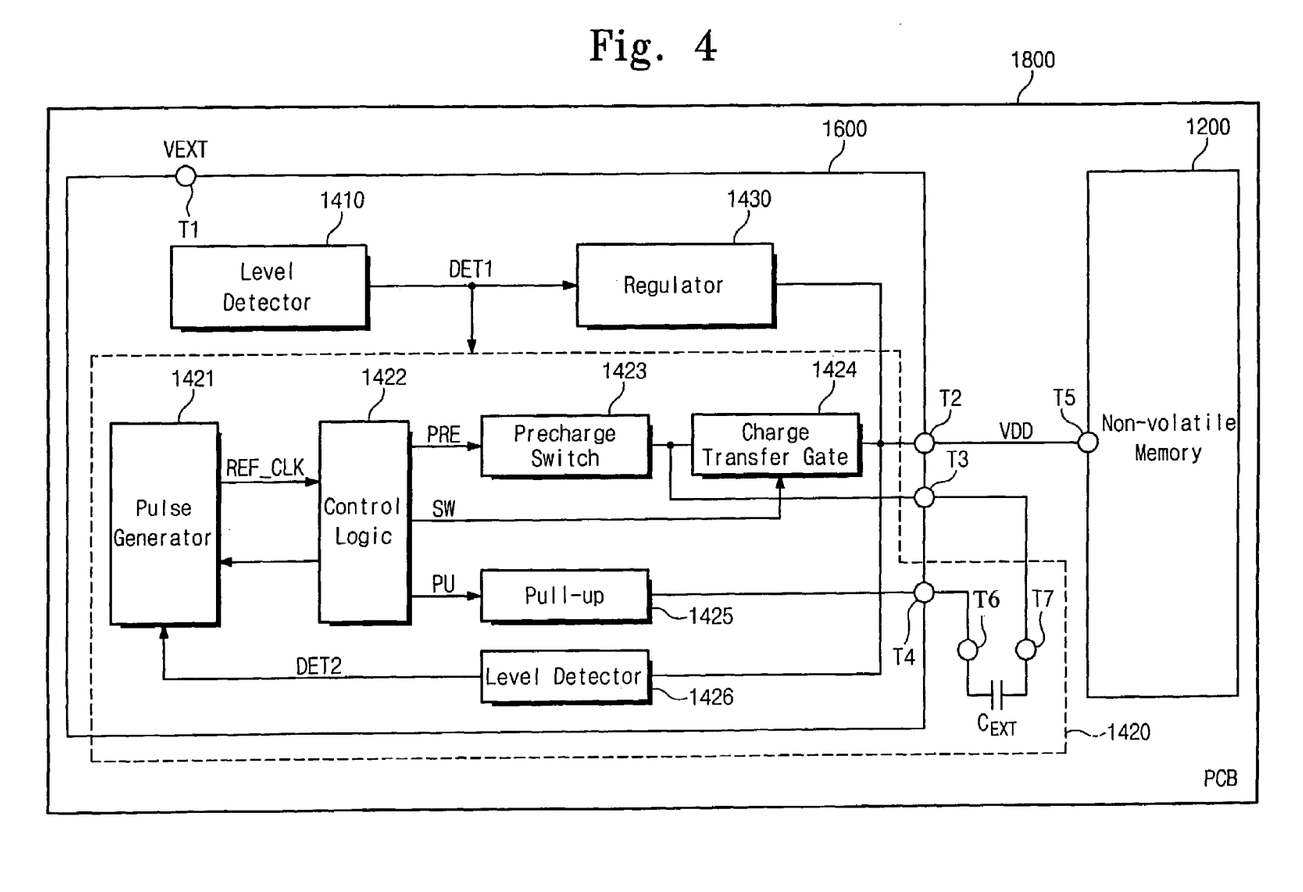
FIG. 4 is a schematic block diagram showing a memory card including a booster circuit according to an exemplary embodiment of the present invention.
Figure 5:
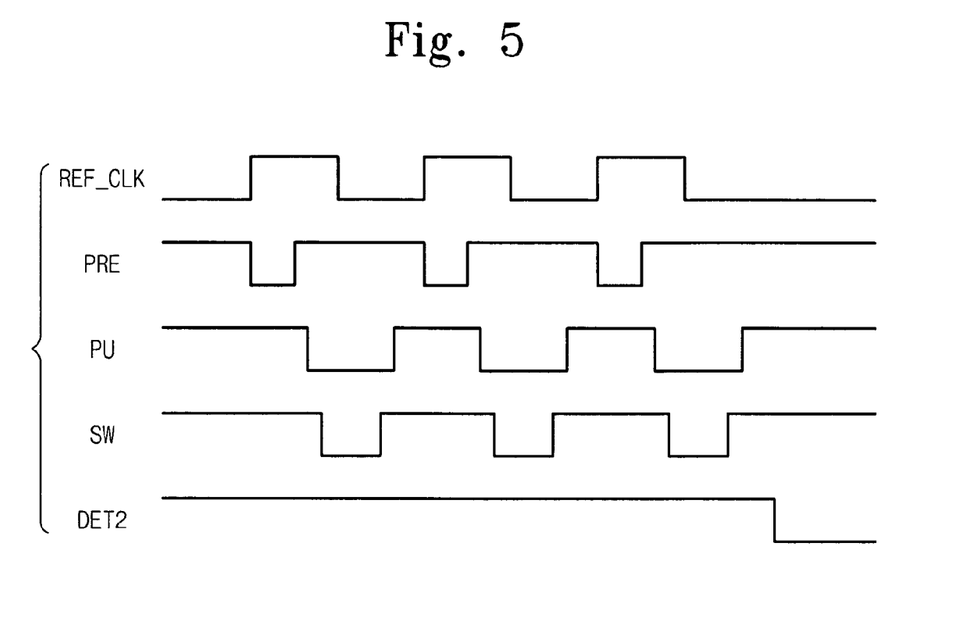
FIG. 5 shows clock signals for describing a boosting operation of a booster circuit in FIG. 4.

FIG. 4 is a schematic block diagram showing a memory card including a booster circuit according to an exemplary embodiment of the present invention. FIG. 5 shows clock signals for illustrating a boosting operation of a booster circuit in FIG. 4.

The power management unit 1400 includes a level detector circuit 1410, a booster circuit 1420 and a regulator circuit 1430. The power management unit 1400 may be integrated in a memory controller 1600 for controlling the non-volatile memory 1200. Preferably, the non-volatile memory 1200 and the memory controller 1600 may be installed at a printed circuit board (PCB). The memory controller 1600 may be supplied with the external supply voltage VEXT via a T1 terminal. The memory controller 1600 outputs an operating voltage VDD to T5 terminal of the non-volatile memory 1200 via T2 terminal. The level detector circuit 1410 and the regulator circuit 1430 are described in FIG. 2.

The booster circuit 1420 according to an exemplary embodiment of the present invention includes a pulse generator 1421, control logic 1422, a pre-charge switch 1423, a charge transfer gate 1424, a pull-up switch 1425, a level detector 1426, and a boosting capacitor CEXT as a passive capacitor. As shown in FIG. 4, the boosting capacitor CEXT of the booster circuit 1420 may be installed outside of the memory controller 1600, i.e., on the printed circuit board 1800. Terminals T6 and T7 of the boosting capacitor CEXT are electrically connected to terminals T3 and T4 of the memory controller 1600. In another exemplary embodiment of the present invention, the boosting capacitor CEXT may be integrated in the memory controller 1600. The boosting capacitor CEXT may be made simultaneously with the printed circuit board 1800. Alternatively, the boosting capacitor CEXT may be installed at the printed circuit board 1800 after the printed circuit board 1800 is made.

The booster circuit 1420 operates when the detection signal DET1 from the level detector circuit 1410 is activated. The level detector 1426 of the booster circuit 1420 is connected to an output of the charge transfer gate 1424. The level detector 1426 determines whether the operating voltage VDD supplied to the non-volatile memory 1200 is lower than a detection voltage. When the external supply voltage VEXT is lower than the detection voltage VDET, the level detector 1426 activates a detection signal DET2. If the external supply voltage VEXT is higher than the detection voltage VDET, the level detector 1426 inactivates the detection signal DET2. The pulse generator 1421 generates a reference clock signal REF_CLK having a certain period in response to activation of the detection signal DET2. When the detection signal DET2 is inactivated, the pulse generator 1421 stops generating the reference clock signal REF_CLK. A detection level of the pulse generator 1421 may be same the as or different from a detection level of the level detector circuit 1410.

Referring to FIG. 5, the control logic 1422 generates control signals such as PRE, SW and PU according to a certain timing in response to the reference clock signal REF_CLK. For example, the control logic 1422 activates the pre-charge control signal PRE during a certain time when the reference clock signal REF_CLK changes from a low level to a high level. The pre-charge switch 1423 charges an input of the charge transfer gate 1424 (i.e. one terminal of the boosting capacitor CEXT) in response to activation of the pre-charge control signal PRE.

After inactivation of the pre-charge control signal PRE, the control logic 1422 activates the pull-up control signal PU. The pull-up switch 1425 drives the terminal T6 of the boosting capacitor CEXT with the external supply voltage VEXT in response to activation of the pull-up control signal PU. This process forces a pre-charged voltage of the T7 terminal of the boosting capacitor CEXT to be boosted up to twice the external supply voltage VEXT.

After inactivation of the pull-up control signal PU, the control logic 1422 activates the switch control signal SW during a certain time. When the switch control signal SW is activated, the charge transfer gate 1424 transfers a voltage (or charges) at the T3 terminal boosted via the boosting capacitor CEXT to the T2 terminal. The operating voltage VDD may increase up to a certain voltage by the above boosting operation that can be performed in every cycle (or period) of the reference clock signal REF_CLK. When the operating voltage VDD increases up to the certain voltage, the level detector 1426 inactivates the detection signal DET2. In other words, the pulse generator 1421 stops generating the reference clock signal REF_CLK. That is, a boosting operation of the boosting circuit 1420 stops.

In an exemplary embodiment, the pre-charge switch 1423 and the charge transfer gate 1424 may be a PMOS transistor. The pull-up switch 1425 may be an inverter.

When the external supply voltage VEXT is lower than a detection voltage the booster circuit 1420 of the power management unit 1400 boosts the external supply voltage VEXT and outputs the boosted voltage as the operating voltage VDD to the non-volatile memory 1200. In an exemplary embodiment of the present invention, the detection voltage is set to be higher than the minimum operating voltage of the non-volatile memory and lower than its operating voltage. When the external supply voltage VEXT is higher than the detection voltage and lower than the operating voltage VDD of the non-volatile memory 1200, the regulator circuit 1430 of the power management unit 1400 outputs the external supply voltage VEXT as the operating voltage VDD to the non-volatile memory 1200. When the external supply voltage VEXT is higher than the operating voltage VDD of the non-volatile memory 1200, the regulator circuit 1430 of the power management unit 1400 regulates the external supply voltage VEXT and outputs the regulated voltage as the operating voltage VDD to the non-volatile memory 1200.

Accordingly, although the external supply voltage VEXT becomes lower than the detection voltage or the minimum operating voltage of the non-volatile memory 1200 due to, for example, a power consumption in the memory card, a stable operation of the non-volatile memory 1200 can be secured by the power management unit 1400.

In particular, the boosting of the external supply voltage VEXT is determined according to whether the external supply voltage VEXT is lower than the detection voltage. The detection voltage may be set to be higher than the minimum operating voltage of the non-volatile memory and lower than its operating voltage. Alternatively, the detection voltage of the level detector circuit 1410 may be set to be the minimum operating voltage of the non-volatile memory 1200.

Figure 6:
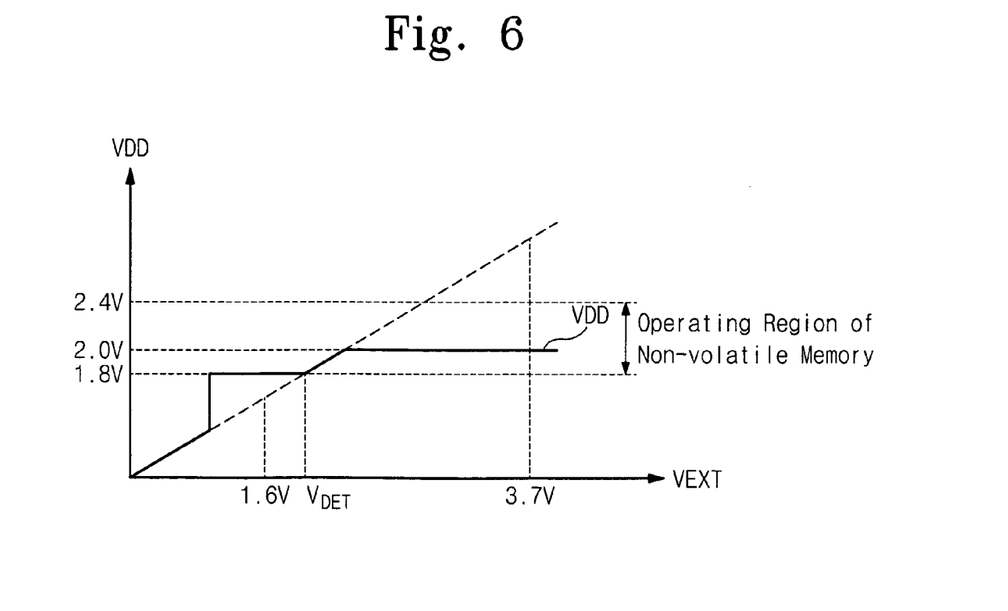
FIGS. 6 and 7 are graphs showing an operating voltage supplied to a non-volatile memory in a memory card according to an exemplary embodiment of the present invention.

A graph of the operating voltage VDD supplied to the non-volatile memory 1200 according to an exemplary embodiment of the present invention is shown in FIG. 6. FIGS. 3 and 6 show examples where the external supply voltage VEXT is boosted up to the detection voltage.

Figure 7:
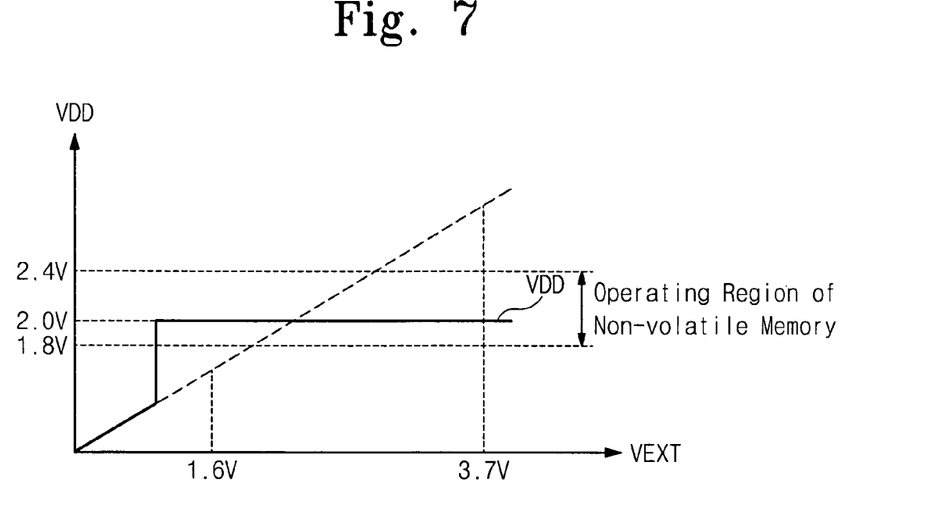

Referring to FIG. 7, the power management unit 1400 may boost the external supply voltage VEXT up to the operating voltage VDD. A graph of the operating voltage VDD supplied to the non-volatile memory 1200 according to another exemplary embodiment of the present invention is shown. When the external supply voltage VEXT is lower than the operating voltage VDD of the non-volatile memory 1200, the booster circuit 1420 of the power management unit 1400 boosts the external supply voltage VEXT and outputs the boosted voltage as the operating voltage VDD to the non-volatile memory 1200. When the external supply voltage VEXT is higher than the operating voltage VDD of the non-volatile memory 1200, the regulator circuit 1430 of the power management unit 1400 regulates the external supply voltage VEXT to the operating voltage VDD and outputs the regulated voltage as the operating voltage VDD to the non-volatile memory 1200.

Figure 8:
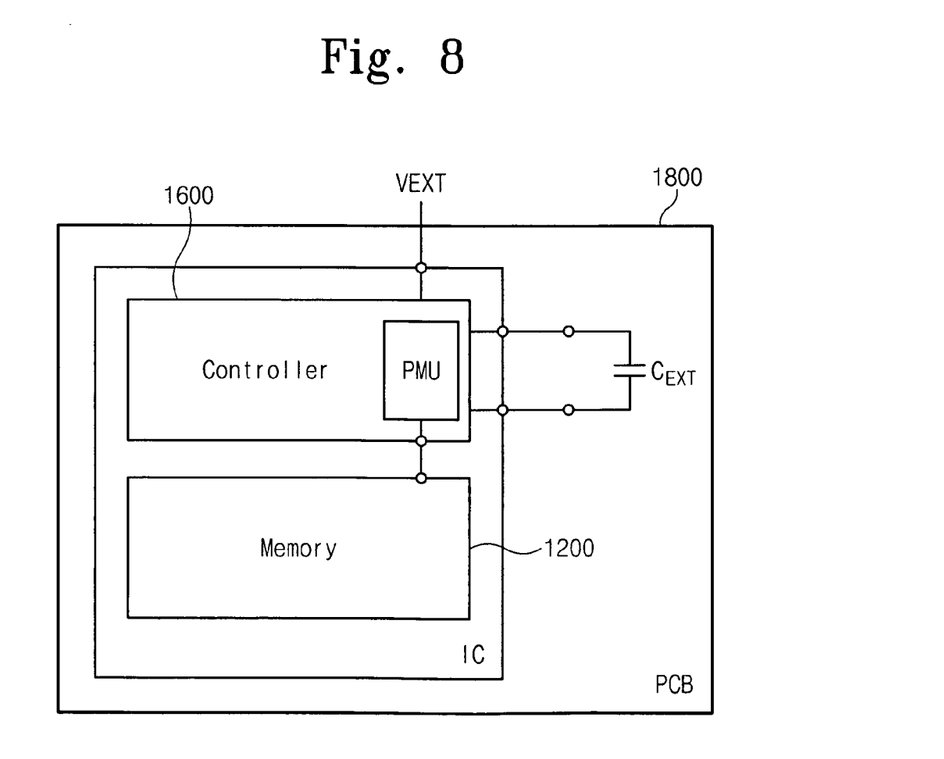
FIG. 8 is a schematic block diagram showing a memory card according to another exemplary embodiment of the present invention.

The memory controller 1600 and the non-volatile memory 1200 according to an exemplary embodiment of the present invention may be individual chips. The boosting capacitor CEXT in the booster circuit 1420 may be formed/integrated outside of the memory controller 1600, i.e., on the printed circuit board 1800. Remaining elements except for the boosting capacitor CEXT may be integrated in the memory controller 1600. In another exemplary embodiment of the present invention, as described in FIG. 8, the memory controller 1600 and the non-volatile memory 1200 can be formed in a single integrated circuit chip. In FIG. 8, the boosting capacitor CEXT is formed at the printed circuit board 1800, i.e., outside of the integrated circuit chip IC including the memory controller 1600 and the non-volatile memory 1200. Remaining elements of the power management unit PMU may be integrated in the integrated circuit chip IC.

Although exemplary embodiments have been described herein with reference to the accompanying drawings, it is to be understood that he present invention is not limited to those precise embodiments, and that various other changes and modifications may be affected therein by one ordinary skill in the related art without departing from the scope of spirit of the invention.

What is claimed is:

1. A memory card comprising:
   a non-volatile memory; and
   a power management unit for receiving an external supply voltage to supply an operating voltage to the non-volatile memory, wherein when the external supply voltage is lower than a detection voltage, the power management unit boosts the external supply voltage and outputs the boosted voltage as the operating voltage of the non-volatile memory.

2. The memory card of claim 1, wherein the detection voltage is higher than a minimum operating voltage of an operating range of the non-volatile memory and lower than the operating voltage.

3. The memory card of claim 2, wherein when the external supply voltage is higher than the detection voltage and lower than the operating voltage, the power management unit outputs the external supply voltage as the operating voltage.

4. The memory card of claim 2, wherein when the external supply voltage is lower than the detection voltage, the power management unit boosts the external supply voltage up to the detection voltage.

5. The memory card of claim 1, wherein the detection voltage is a minimum operating voltage of an operating range of the non-volatile memory.

6. The memory card of claim 5, wherein when the external supply voltage is higher than the operating voltage, the power management unit regulates the external supply voltage up to the operating voltage.

7. The memory card of claim 1, wherein the non-volatile memory is a flash memory, a ferro-electric RAM, a magneto-resistive RAM, or a phase-change RAM.

8. The memory card of claim 1, wherein the power management unit comprises a passive capacitor and boosts the external supply voltage, the passive capacitor being installed as an individual element on a printed circuit board where the power management unit is installed.

9. The memory card of claim 1, wherein the power management unit includes a level detector circuit for detecting whether the external supply voltage is lower than a detection voltage and a voltage converter circuit for either boosting the external supply voltage or regulating the external supply voltage to the operating voltage based on a detection result of the level detector circuit.

10. The memory card of claim 9, wherein the voltage converter circuit comprises:
   a booster for operating in response to an output of the level detector circuit and boosting the external supply voltage, the boosted voltage being outputted as the operating voltage; and
   a regulator for regulating the external supply voltage to the operating voltage in response to the output of the level detector circuit.

11. The memory card of claim 10, wherein the booster comprises a passive capacitor installed as an individual element on a printed circuit board where the power management unit is installed.

12. A memory card comprising:
   a printed circuit board;
   a passive capacitor installed at the printed circuit board;
   a non-volatile memory chip installed at the printed circuit board; and
   a controller circuit chip installed at the printed circuit board, for receiving an external supply voltage to supply an operating voltage to the non-volatile memory chip, wherein the controller circuit chip performs a boosting operation using the passive capacitor when the external supply voltage is lower than a detection voltage, the boosted voltage being outputted as the operating voltage of the non-volatile memory chip.

13. The memory card of claim 12, wherein the detection voltage is higher than a minimum operating voltage of an operating range of the non-volatile memory chip and lower than the operating voltage.

14. The memory card of claim 13, wherein when the external supply voltage is lower than the detection voltage, the controller circuit chip boosts the external supply voltage using the passive capacitor and outputs the boosted voltage as the operating voltage.

15. The memory card of claim 13, wherein when the external supply voltage is higher than the detection voltage and lower than the operating voltage, the controller circuit chip outputs the external supply voltage as the operating voltage.

16. The memory card of claim 12, wherein the detection voltage is a minimum operating voltage of an operating range of the non-volatile memory chip.

17. The memory card of claim 16, wherein when the external supply voltage is lower than the detection voltage, the controller circuit chip boosts the external supply voltage up to the operating voltage using the passive capacitor.

18. The memory card of claim 12, wherein the control circuit chip includes:
   a level detector circuit for detecting whether the external supply voltage is lower than a detection voltage; and
   a booster control circuit for boosting the external supply voltage using the passive capacitor when the external supply voltage is lower than the detection voltage.

19. A memory card comprising:
   a printed circuit board;
   a passive capacitor installed at the printed circuit board; and
   an integrated circuit chip installed at the printed circuit board and including a non-volatile memory and a controller circuit chip,
   wherein the integrated circuit chip includes:
   a level detector circuit for detecting whether the external supply voltage is lower than a detection voltage; and
   a booster control circuit for boosting the external supply voltage using the passive capacitor when the external supply voltage is lower than the detection voltage.

20. The memory card of claim 19, wherein the detection voltage is higher than a minimum operating voltage of an operating range of the non-volatile memory chip and lower than the operating voltage.

21. The memory card of claim 19, wherein the integrated circuit chip further comprises a regulator that outputs the external supply voltage as the operating voltage when the external supply voltage is higher than the detection voltage and lower than the operating voltage, and regulates the external supply voltage to the operating voltage when the external supply voltage is higher than the operating voltage of the non-volatile memory chip.

22. The memory card of claim 19, wherein a booster circuit for boosting the external supply voltage comprises the passive capacitor and the booster control circuit.

* * * * *